US010242931B2

(12) United States Patent
Bezama et al.

(10) Patent No.: US 10,242,931 B2
(45) Date of Patent: Mar. 26, 2019

(54) LIQUID COOLED COMPLIANT HEAT SINK AND RELATED METHOD

(71) Applicant: International Business Machines Corporation, Armonk, NY (US)

(72) Inventors: Raschid J. Bezama, Mahopac, NY (US); David C. Long, Wappingers Falls, NY (US); Govindarajan Natarajan, Poughkeepsie, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 14/936,902

(22) Filed: Nov. 10, 2015

(65) Prior Publication Data

US 2016/0064306 A1  Mar. 3, 2016

Related U.S. Application Data

(62) Division of application No. 12/698,430, filed on Feb. 2, 2010, now abandoned.

(Continued)

(51) Int. Cl.
*F28F 7/00* (2006.01)
*H01L 23/473* (2006.01)
(Continued)

(52) U.S. Cl.
CPC .......... *H01L 23/4735* (2013.01); *F28D 15/00* (2013.01); *H01L 23/3733* (2013.01);
(Continued)

(58) Field of Classification Search
CPC ............... H01L 23/4735; H01L 23/473; H01L 23/3733; H01L 21/4882; H01L 23/36; H01L 23/367; H01L 23/4336; F28D 2021/0028; F28D 2021/0029; F28D 15/00; F28F 3/00; H05K 7/20409
(Continued)

(56) References Cited

U.S. PATENT DOCUMENTS 4,109,707 A    8/1978  Wilson et al.
5,150,274 A *  9/1992  Okada ................. H01L 23/3733
                                                    165/185

(Continued)

OTHER PUBLICATIONS

Thompson, Office Action Communication for U.S. Appl. No. 12/698,430 dated Apr. 11, 2013, 11 pages.

(Continued)

*Primary Examiner* — Jason Thompson
(74) *Attorney, Agent, or Firm* — Steven J. Meyers; Hoffman Warnick LLC

(57) ABSTRACT

A heat sink and method for using the same for use in cooling an integrated circuit (IC) chip is provided herein. The heat sink includes a manifold block, a liquid-filled cooling system, and a compliant foil affixed to the manifold block and backed by a liquid in the closed loop cooling system. The pressure provided by the liquid behind the foil causes the foil to bow, and to conform to non-planarities in the surface of the IC chip, thus reducing air gaps and increasing thermal coupling between the IC chip and the heat sink.

6 Claims, 3 Drawing Sheets

Related U.S. Application Data

(60) Provisional application No. 61/150,914, filed on Feb. 9, 2009.

(51) Int. Cl.
| | | |
|---|---|---|
| *F28D 15/00* | (2006.01) | |
| *H01L 23/373* | (2006.01) | |
| *F28F 13/00* | (2006.01) | |

(52) U.S. Cl.
CPC ............ *H01L 23/473* (2013.01); *F28F 13/00* (2013.01); *F28F 2013/006* (2013.01); *H01L 2924/0002* (2013.01)

(58) Field of Classification Search
USPC ........................................................ 165/80.4
See application file for complete search history.

(56) References Cited

U.S. PATENT DOCUMENTS

| | | | |
|---|---|---|---|
| 5,245,508 A | 9/1993 | Mizzi | |
| 5,265,670 A | 11/1993 | Zingher | |
| 5,323,292 A | 6/1994 | Brzezinski | |
| 5,365,402 A * | 11/1994 | Hatada ................ H01L 23/3677 | |
| | | | 165/80.4 |
| 5,761,037 A * | 6/1998 | Anderson ............ F28D 15/0266 | |
| | | | 165/104.26 |
| 6,367,543 B1 * | 4/2002 | Calaman ................ F28F 3/022 | |
| | | | 165/134.1 |
| 6,411,513 B1 | 6/2002 | Bedard | |
| 6,889,756 B1 | 5/2005 | Hou | |
| 7,149,085 B2 * | 12/2006 | Chebiam ............... F04B 19/006 | |
| | | | 165/80.4 |
| 7,255,153 B2 | 8/2007 | Berger et al. | |
| 7,593,228 B2 | 9/2009 | Jarrett et al. | |
| 7,626,407 B2 * | 12/2009 | Kabbani ............... H01L 23/473 | |
| | | | 165/80.4 |
| 8,987,891 B2 | 3/2015 | Di Stefano | |
| 2002/0003550 A1 | 1/2002 | Berg et al. | |
| 2004/0074630 A1 * | 4/2004 | Sen ...................... H01L 23/433 | |
| | | | 165/46 |
| 2004/0190255 A1 | 9/2004 | Cheon | |
| 2005/0039884 A1 * | 2/2005 | Pawlenko ................. F28F 3/02 | |
| | | | 165/80.4 |
| 2005/0061474 A1 | 3/2005 | Gelorme et al. | |
| 2005/0210906 A1 | 9/2005 | Laufer et al. | |
| 2006/0196646 A1 * | 9/2006 | Myers .................... H01L 23/473 | |
| | | | 165/134.1 |
| 2006/0266497 A1 | 11/2006 | Berger et al. | |
| 2007/0034356 A1 | 2/2007 | Kenny et al. | |
| 2007/0159799 A1 | 7/2007 | Dando, III et al. | |
| 2007/0163755 A1 * | 7/2007 | Kim ...................... H01L 23/427 | |
| | | | 165/104.26 |
| 2007/0177367 A1 | 8/2007 | Bailey et al. | |
| 2007/0227173 A1 | 10/2007 | Bezama et al. | |
| 2007/0256810 A1 * | 11/2007 | Di Stefano ........... H01L 23/473 | |
| | | | 165/46 |
| 2007/0272392 A1 | 11/2007 | Ghosh et al. | |
| 2008/0092553 A1 | 4/2008 | Hochgraeber et al. | |
| 2008/0166492 A1 * | 7/2008 | Lu ......................... H01L 23/473 | |
| | | | 427/432 |
| 2008/0225484 A1 * | 9/2008 | Brodsky ................. H01L 23/42 | |
| | | | 361/699 |
| 2010/0200197 A1 | 8/2010 | Bezama et al. | |
| 2010/0328888 A1 * | 12/2010 | Campbell ........... H01L 23/4735 | |
| | | | 361/699 |
| 2016/0300780 A1 | 10/2016 | Bezama et al. | |

OTHER PUBLICATIONS

Thompson, Office Action Communication for U.S. Appl. No. 12/698,430 dated Mar. 10, 2014, 24 pages.
Thompson, Office Action Communication for U.S. Appl. No. 12/698,430 dated Oct. 4, 2012, 13 pages.
Thompson, Office Action Communication for U.S. Appl. No. 12/698,430 dated Sep. 5, 2013, 13 pages.
Thompson, Office Action Communication for U.S. Appl. No. 12/698,430 dated Mar. 17, 2016, 24 pages.
Thompson, Office Action Communication for U.S. Appl. No. 15/186,588 dated Aug. 23, 2017, 26 pages.
Non Final Office Action dated Feb. 21, 2018 for U.S. Appl. No. 15/186,588, filed Jun. 20, 2016, 26 pages.
Final Office Action dated Jun. 22, 2018 for U.S. Appl. No. 15/186,588, filed Jun. 20, 2016, 17 pages.

* cited by examiner

LIQUID COOLED COMPLIANT HEAT SINK AND RELATED METHOD

BACKGROUND

1. Technical Field

The disclosure relates generally to integrated circuit (IC) chip packaging, testing, and use in computer hardware. More particularly, it relates to a heat sink for cooling IC chips and packages, including a compliant foil surface backed by a liquid-filled cooling system; and a related method.

2. Background Art

During integrated circuit (IC) chip fabrication and packaging, IC chips are tested and burned in at high power to determine whether they perform as required. The high power testing exposes the IC chip to high temperatures. As IC chip feature sizes have continually decreased, more power is required for driving a unit area of silicon (Si) devices, resulting in increased heat generation. In addition, higher burn-in powers result in higher heat gradients across the IC chip.

A typical burn-in testing tool comprises a test socket and heat sink as well as related mechanical structures and electronics. During burn-in testing, the tester heat sink is thermally coupled to the IC chip to dissipate heat.

Heat sinks are also widely used in electronics, particularly in integrated circuits such as microprocessors, digital signal processors, graphic processing units, and other components that require a heat sink to reduce their temperatures through increased thermal mass and heat dissipation.

Previous generations of IC chips were cooled using heat sinks that were coated with a flat, soft alloy to improve thermal contact. Liquid thermal interfaces (LTIs) have also been placed between the heat sink and the IC chip to compensate for non-planarities in the chip surface and the mating heat sink surface. LTIs function to minimize the occurrence of any air gaps between the two surfaces, which would result in a significant reduction in thermal performance and the ability to remove heat from the chip. Poly-alpha olefin (PAO) oil has been used as an LTI to increase heat transfer. However, PAO oils can degrade at the high temperatures and long times necessary for burn-in testing. Water based fluids have also been used as LTIs in test. Despite excellent thermal performance, they have not proven suitable for use at high temperatures, and can cause corrosion of sensitive devices.

The use of LTIs as a cooling solution further poses a risk of corrosion of the controlled collapse chip connection (C4) as a result of LTI entering the C4 cage. The C4 is an interconnect mounting technology for semiconductor devices developed by International Business Machines Corp. The use of LTIs as a cooling solution also requires additional cleaning steps after test if the material does not evaporate fully.

Another current cooling solution involves the use of a dry thermal interface, in which air or helium is injected into the interface between the IC chip and the heat sink. The use of this cooling solution requires that the testing capabilities be reduced in order to avoid overheating the chip, thus making it inappropriate for future generations of IC chips with smaller features.

Because IC chips have irregular surfaces, there are usually only a few points of contact between the heat sink and the chip when the heat sink is pressed into contact with the IC chip with a force. The remainder of the area will have a gap which is defined by the flatness of the two surfaces and the force applied. The larger the gap between the heat sink and the IC chip, the less efficient the cooling means will be.

SUMMARY

A structure and method for providing improved cooling of a substrate, which may be an integrated circuit (IC) chip during test and burn-in, an IC chip or package in a computer, or another substrate, are disclosed.

A first aspect of the disclosure provides a method including: providing an integrated circuit (IC) chip; providing a heat sink including a variable volume liquid-filled chamber within the heat sink and a thermally conductive, compliant foil backed by a liquid in the variable volume liquid-filled chamber; thermally coupling the IC chip with the heat sink, the thermal coupling including pressurizing the compliant foil with the liquid in the variable volume liquid-filled chamber, and conforming the compliant foil to a surface of the IC chip; and cooling the IC chip, wherein heat is conducted from the IC chip to the compliant foil, and from the compliant foil to the liquid in the variable volume liquid-filled chamber.

A second aspect of the disclosure provides a heat sink for cooling an integrated circuit (IC) chip, the heat sink comprising: a liquid-filled cooling system including a variable volume liquid-filled chamber; and a thermally conductive, compliant foil backed by a liquid in the variable volume liquid-filled chamber, wherein a pressure of the liquid on the compliant foil provides a uniform pressure by the foil against the IC chip and causes the compliant foil to conform to a surface of the IC chip.

A third aspect of the disclosure provides a method including: providing an integrated circuit (IC) chip; providing a heat sink including a variable volume liquid-filled chamber within the heat sink, and a compliant foil made of BeCu, the compliant foil being backed by a liquid in the variable volume liquid-filled chamber, thermally coupling the IC chip with the heat sink, wherein the thermal coupling includes pressurizing the compliant foil with the liquid in the variable volume liquid-filled chamber, and conforming the compliant foil to a surface of the IC chip; and circulating the liquid through the heat sink in a closed loop, the circulating including chilling the liquid in a refrigerated recirculator prior to passing the liquid into the heat sink; passing the liquid into the variable volume liquid-filled chamber in the heat sink via an input port in the heat sink; and returning the liquid from the variable volume liquid-filled chamber in the heat sink via a return port in the heat sink.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
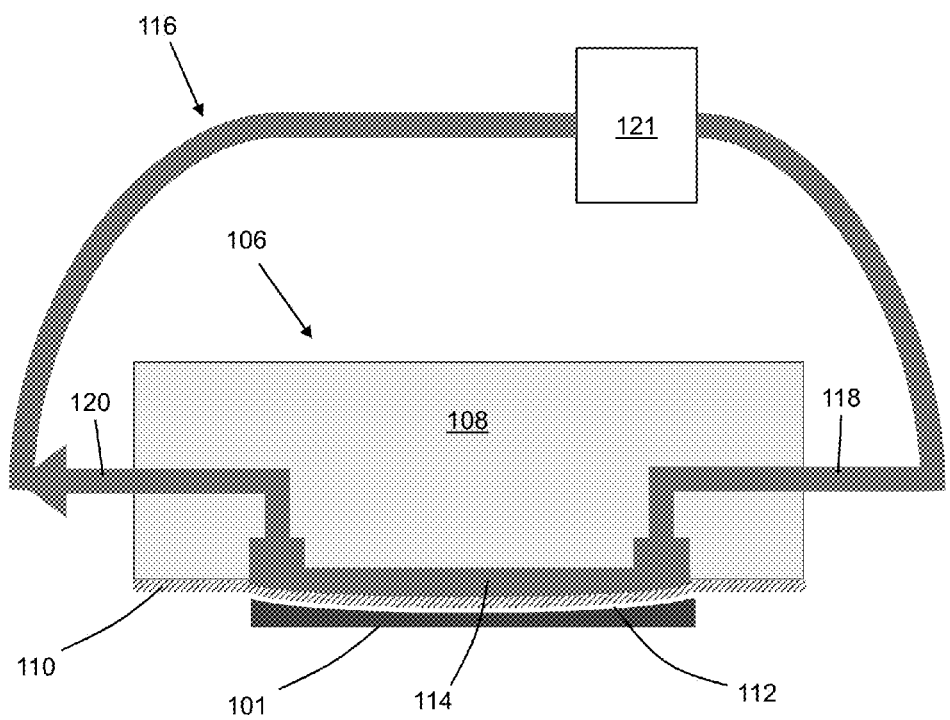
FIG. 1 shows an illustrative heat sink according to an embodiment disclosed herein.
Figure 2:
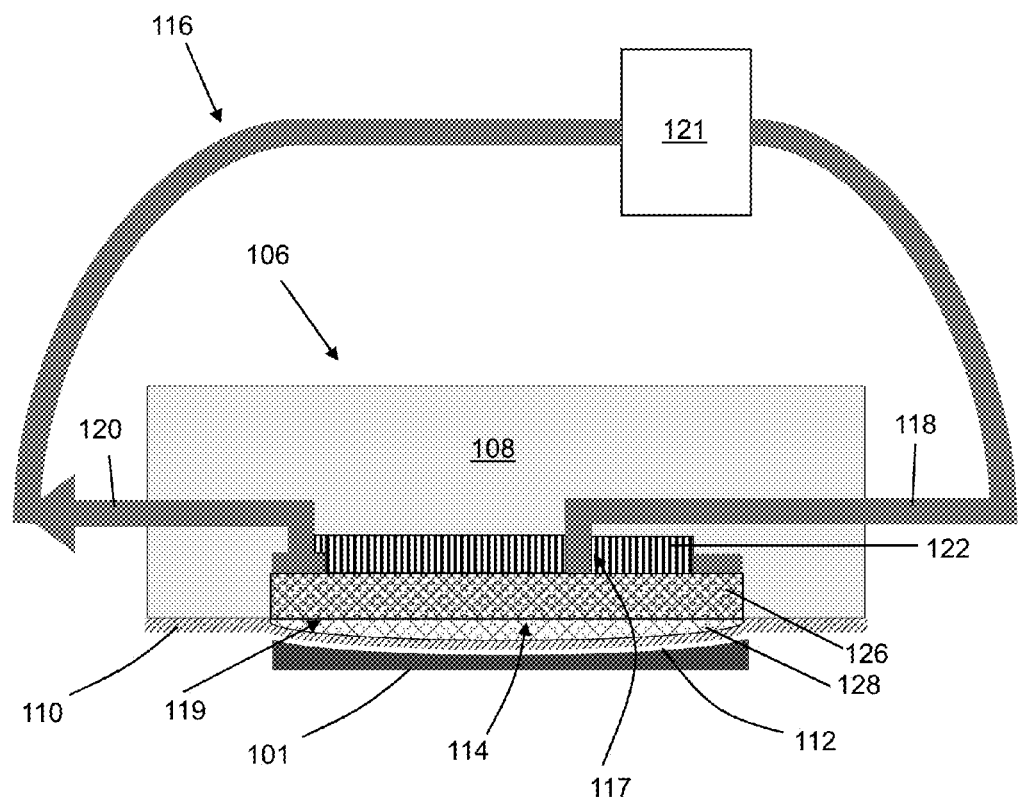
FIGS. 2-3 show additional illustrative heat sink embodiments also disclosed herein.
Figure 3:
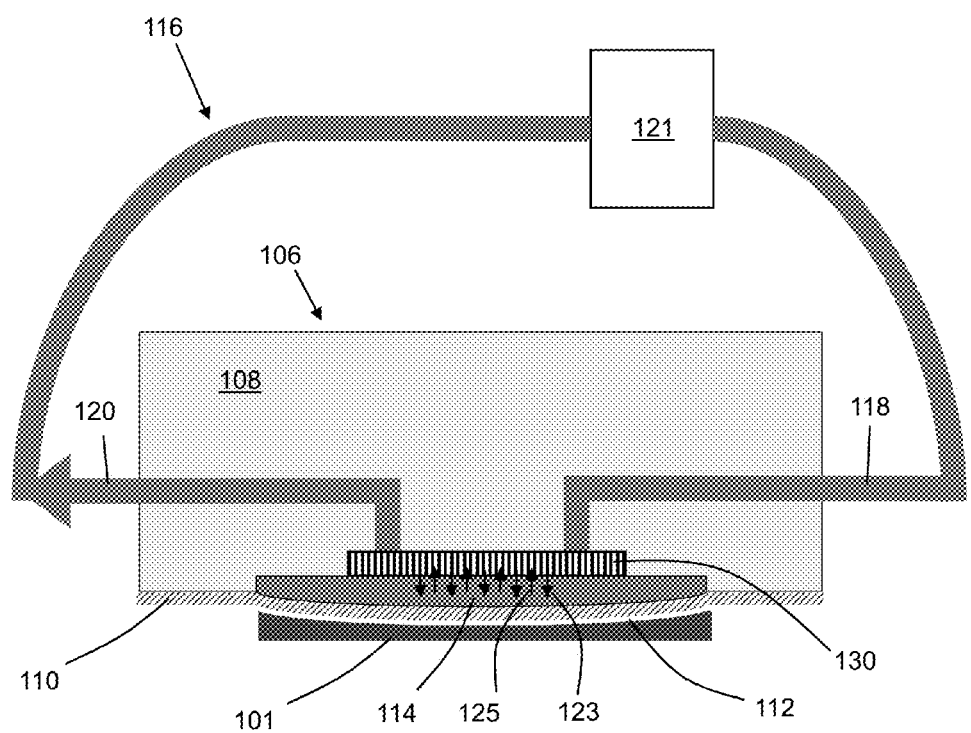

Referring to the drawings, embodiments of the structure and method according to the disclosure are shown in FIGS. 1-3.

Turning to FIG. 1, a detailed view of an embodiment of heat sink 106 according to embodiments of the invention is shown. Heat sink 106 includes a manifold block 108, which may be copper. In various other embodiments, manifold block 108 may be aluminum, stainless steel, plastic, ceramic and/or may be plated with various materials, including but not limited to nickel, gold, and silver. A compliant foil 110 is affixed to manifold block 108, forming an interface 112 between heat sink 106 and a surface of IC chip 101. Compliant foil 110 is thin, and made of a thermally conductive material. Foil 110 may be made of beryllium copper (BeCu) and may measure approximately 75 μm in thickness, however, in various alternative embodiments, foil 110 may be made of other conductive materials including but not limited to copper, indium, gold, silver, and stainless steel, and may measure less than 250 μm in thickness. As the thickness of foil 110 gets thinner, greater compliance is provided at the expense of strength.

Foil 110 is backed by a chamber 114, which is part of liquid-filled cooling system 116, and located in heat sink 106. Cooling system 116 is filled with a liquid which circulates through the system to carry heat away from IC chip 101. In a further embodiment, foil 110 may be patterned on the side in contact with the liquid, providing increased surface area for improved cooling.

In one embodiment, the liquid is water, however, in various alternative embodiments the liquid may comprise one of a solution of water and anti-oxidant agents, a solution of water and glycol, any other glycol-based liquids, liquid metal, and a solution of water and an antibacterial agent(s).

The liquid circulates through cooling system 116, entering chamber 114 by passing through input port 118, and exits chamber 114 via return port 120. The liquid present in chamber 114 pressurizes compliant foil 110, which causes foil 110 to conform to, or mate with, any non-planarities in the surface of IC chip 101, and provide uniform pressure on IC chip 101. This conformity results in improved thermal performance by reducing the occurrence of air gaps between heat sink 106 and IC chip 101 with results approaching 100% conformity. 100% conformity may be achieved where IC chip 101 includes a highly polished and flat surface.

As shown in the embodiment depicted in FIG. 1, the liquid is contained in a closed loop system. In one embodiment, after the liquid has exited chamber 114 through liquid return port 120, it continues in closed loop cooling system 116 to chiller 121. Chiller 121 cools the liquid after it has passed through chamber 114 of heat sink 106. In one embodiment, chiller 121 is a refrigerated recirculator. The refrigerated recirculator 121 chills the liquid and pumps the liquid through the liquid-filled cooling system 116. After the liquid has passed through chiller 121, the liquid continues in the closed loop path, returning to the heat sink 106 via input port 118.

The locations or positions of input port 118 and return port 120 in heat sink 106 may further be optimized for specific applications. For example, in various embodiments, input port 118 may be located above specific hot spots, or cores, of IC chip 101, and return port 120 may be located around the perimeter or in corners of IC chip 101 for optimal performance.

In an additional embodiment, the liquid may also be contained in an open loop system. In such an open loop system, cooling system 116 does not form a loop, causing the liquid to pass through heat sink 106, but not re-circulate. Liquid enters heat sink 106 via input port 118, exits heat sink 106 via return port 120, and continues in cooling system 116, rather than ultimately returning to heat sink 106.

In a further embodiment, the liquid may be contained in a static situation rather than an open or closed loop. In a static situation, manifold block 108 further includes a means for cooling the heat sink, including the liquid, further aiding in the cooling of IC chip 101. The means for cooling may include, for example, cooling channels flowing through manifold block 108, or a cold plate mounted above manifold block 108. In a static situation, chamber 114 may comprise a liquid-filled bladder without input or return ports 118 and 120.

FIG. 2 shows an alternative embodiment of a heat sink and liquid-filled cooling system according to this disclosure, including an elastomeric material member 122 such as silicone rubber, and mesh member 119 located in chamber 114. Elastomeric material member 122 includes a through-port 117, and is located adjacent to the manifold block 108. Mesh member 119 comprises coarse mesh member 126, and fine mesh member 128, and is located adjacent to the elastomeric material member 122. Coarse mesh and fine mesh will be understood to mean the relative size of the mesh openings in the respective mesh members, such that coarse mesh member openings are larger than the mesh openings of fine mesh members. Coarse and fine mesh members 126 and 128 may be comprised of any type of highly thermally conductive material, preferably metallic mesh made from materials including but not limited to copper and stainless steel. Mesh member 119 is configured such that coarse mesh member 126 is located between elastomeric material member 122 and fine mesh member 128.

Liquid traveling in cooling system 116 enters heat sink 106 via input port 118, passes through through-port 117 into mesh member 119, where it reaches the backside of compliant foil 110. Foil 110's compliance is provided by pressure generated by elastomeric material member 122 and transmitted through mesh member 119 to foil 110. Liquid flows freely through coarse mesh member 126 and fine mesh member 128, providing improved thermal contact between coarse mesh member 126 and foil 110. The liquid then exits heat sink 106 via return port 120 as described above.

FIG. 3 shows a further embodiment of the heat sink and liquid-filled cooling system and accompanying method described above. In this embodiment, heat sink 106 further includes a microjet device 130 mounted to manifold block 108. Alternatively, microjet device 130 may be machined into manifold block 108. Microjet device 130 may be manufactured from a ceramic, although other materials known in the art may also be used. The use of such a microjet device as an impingement device is disclosed in US Patent Application Publication No. 2007/0227173, as well as U.S. Pat. No. 7,255,153, which are hereby incorporated by reference in their entirety.

Microjet device 130 includes a plurality of supply jets 123 for introducing liquid into chamber 114 at a pressure, and a plurality of drains 125 arranged such that each supply jet 123 is surrounded by drains 125. Drains 125 facilitate the return of the liquid to cooling system 116 via return port 120. The liquid supplied by supply jets 123 in microjet device 130 causes compliant foil 110 to further bow to conform to the surface of IC chip 101. In a possible embodiment, microjet device 130 includes a total of 3,281 holes; 1,600 supply jets 123 for supplying liquid and 1,681 drains 125 for returning liquid to cooling system 116, arranged in a 40×40 jet array and a 41×41 drain array. In a further embodiment, supply jets 123 and drains 125 in microjet device 130 measure approximately 126 µm in diameter. Liquid is supplied to and returned from heat sink 106 and microjet device 130, and chilled, as described above relative to FIG. 1.

A further embodiment includes a method of cooling an integrated circuit (IC) chip. A heat sink 106 is provided, including a manifold block 108; a liquid-filled cooling system 116 including a variable volume liquid-filled chamber 114; a liquid contained in the cooling system 116; and a compliant foil 110. Compliant foil 110 may be affixed to manifold block 108 and is backed by a liquid in variable volume liquid-filled chamber 114.

Heat sink 106 thermally couples with IC chip 101, to cool IC chip 101. The liquid present in chamber 114 pressurizes foil 110, and provides a uniform pressure by foil 110 against a surface of IC chip 101. This uniform pressure at interface 112 between IC chip 101 causes foil 110 to conform to the surface of IC chip 101. Heat is conducted from the IC chip 101 to compliant foil 110, and from compliant foil 110 to the liquid in the variable volume liquid-filled chamber 114, cooling IC chip 101.

In one embodiment of the method, the liquid is further circulated through heat sink 106 in a liquid-filled cooling system comprising a closed loop. The liquid is chilled by chiller 121 prior to passing through heat sink 106. The liquid is passed through heat sink 106, entering heat sink 106 via input port 118, and exiting chamber heat sink 106 via return port 120.

In a further embodiment of the method, the liquid is passed through heat sink 106 in liquid-filled cooling system comprising an open loop. The liquid enters heat sink 106 via input port 118, and exits heat sink 106 via return port 106, and continues to flow through cooling system 116.

In a further embodiment, a liquid thermal interface (LTI) may be used in conjunction with any of the afore-described heat sink embodiments and related methods according to the claimed invention. The LTI may be used to provide improved thermal coupling at interface 112. The LTI may comprise any of poly-alpha olefin (PAO) oil, water based fluids, or any other now known or later developed LTI.

The methods and structures as described above may be used in a variety of applications in addition to cooling IC chips. The methods and structures may also be used in various cooling applications including but not limited to: cooling IC chips and packages in a computer, cooling IC chips during test and burn-in in the course of the fabrication of integrated circuit chips, and cooling other devices and structures known in the art. Further, although the methods and structures are described as removing heat from an IC chip or other device or structure, they may also be used to heat an IC chip or other device or structure. Such heating may be accomplished using a liquid that is heated by a heater rather than cooled by chiller 121, according to methods well known in the art.

Newly fabricated IC chips can be distributed by the fabricator in raw wafer form (that is, as a single wafer that has multiple unpackaged chips), as a bare die, or in a packaged form. In the latter case the chip is mounted in a single chip package (such as a chip carrier, with leads that are affixed to a motherboard or other higher level carrier) or in a multichip package (such as a chip carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A heat sink system for cooling an integrated circuit (IC) chip, the heat sink system comprising:
   a manifold block;
   a variable volume liquid-filled chamber positioned within the manifold block;
   an elastomeric material member positioned within a recess of the manifold block, the elastomeric material member defining a portion of the variable volume liquid-filled chamber;
   a through-port formed through the elastomeric material member;
   a mesh member disposed within the variable volume liquid filled chamber, the mesh member including:
      a first mesh member positioned below the elastomeric material member, the first mesh member including a first mesh size; and
      a second mesh member positioned between the first mesh member and the elastomeric material, the second mesh member including a second mesh size that is less than the first mesh size of the first mesh member; and
   a compliant foil that is thermally conductive, the compliant foil positioned below and contacting the first mesh member of the mesh member,
   wherein the compliant foil is backed by a liquid in the variable volume liquid-filled chamber, and
   wherein a pressure of the liquid on the compliant foil provides a uniform pressure by the compliant foil against the IC chip and causes the compliant foil to conform to a surface of the IC chip.

2. The heat sink system of claim 1, further comprising a closed loop including:
 a refrigerated recirculator for chilling the liquid prior to circulating the liquid through the variable volume liquid-filled chamber;
 an input port for liquid to enter the variable volume liquid-filled chamber through the manifold block, the input port in fluid communication with the through-port formed through the elastomeric material member; and
 a return port for liquid to exit the variable volume liquid-filled chamber through the manifold block.

3. The heat sink system of claim 2, wherein the second mesh member of the mesh member includes mesh openings that are larger than mesh openings defined by the first mesh member, and
 wherein the liquid enters the manifold block via the input port, passes through the through-port, into the mesh member, and exits the manifold block via the return port.

4. The heat sink system of claim 1, wherein the compliant foil comprises BeCu.

5. The heat sink system of claim 1, further including a liquid thermal interface (LTI) located between the compliant foil and the IC chip.

6. A heat sink system for cooling an integrated circuit (IC) chip, the heat sink system comprising:
 a manifold block;
 a variable volume liquid-filled chamber positioned within the manifold block;
 an elastomeric material member positioned within a recess of the manifold block;
 a through-port formed through the elastomeric material member;
 a mesh member disposed within the variable volume liquid filled chamber; and
 a compliant foil that is thermally conductive, the compliant foil positioned adjacent the mesh member,
 wherein the compliant foil is backed by a liquid in the variable volume liquid-filled chamber, and
 wherein a pressure of the liquid on the compliant foil provides a uniform pressure by the compliant foil against the IC chip and causes the compliant foil to conform to a surface of the IC chip.

* * * * *